US012787473B2

(12) United States Patent
Liu et al.

(10) Patent No.: US 12,787,473 B2
(45) Date of Patent: Nov. 3, 2026

(54) LIGHT SENSING ELEMENT AND MANUFACTURING METHOD THEREOF

(71) Applicant: Taiwan-Asia Semiconductor Corporation, Hsinchu City (TW)

(72) Inventors: Yang-Ting Liu, Hsinchu City (TW); You-Hsien Chang, Hsinchu City (TW)

(73) Assignee: TAIWAN-ASIA SEMICONDUCTOR CORPORATION, Hsinchu City (TW)

( * ) Notice: Subject to any disclaimer, the term of this patent is extended or adjusted under 35 U.S.C. 154(b) by 370 days.

(21) Appl. No.: 18/532,055

(22) Filed: Dec. 7, 2023

(65) Prior Publication Data

US 2024/0222545 A1 Jul. 4, 2024

(30) Foreign Application Priority Data

Dec. 29, 2022 (TW) ................................ 111150770

(51) Int. Cl.

| | |
|---|---|
| ***H10F 77/30*** | (2025.01) |
| ***H10F 30/225*** | (2025.01) |
| ***H10F 71/00*** | (2025.01) |
| ***H10F 77/124*** | (2025.01) |
| ***H10F 77/14*** | (2025.01) |

(52) U.S. Cl.

CPC ..... *H10F 71/1272* (2025.01); *H10F 30/2255* (2025.01); *H10F 77/1248* (2025.01); *H10F 77/147* (2025.01); *H10F 77/337* (2025.01)

(58) Field of Classification Search

CPC ............... H10F 30/223; H10F 30/2255; H10F 71/1272; H10F 77/1248; H10F 77/147; H10F 77/331; H10F 77/337

See application file for complete search history.

(56) References Cited

U.S. PATENT DOCUMENTS 7,286,588 B2 * 10/2007 Stacey .................. B82Y 20/00 372/102
2005/0152422 A1 * 7/2005 Stacey .................. B82Y 20/00 372/49.01
2024/0213395 A1 * 6/2024 Liu ........................ H10F 71/00

FOREIGN PATENT DOCUMENTS

CN 110021617 A * 7/2019 .......... H10F 39/024
TW 201735384 A 10/2017

* cited by examiner

*Primary Examiner* — Telly D Green

(74) *Attorney, Agent, or Firm* — MUNCY, GEISSLER, OLDS & LOWE, P.C.

(57) ABSTRACT

The present invention provides a manufacturing method for a light sensing element. The method includes the following steps: providing an epitaxy; performing a device process to form a semiconductor structure on the epitaxy, wherein the semiconductor structure includes a light absorbing layer and a plurality of sidewalls; performing a wet etching process to form a recess inward from a sidewall surface of each sidewall of the semiconductor structure; and performing a coating process to form a bandpass filter layer on the semiconductor structure. Light incident from each of the sidewalls is blocked from entering the light absorbing layer by the recess of each of the sidewalls.

8 Claims, 3 Drawing Sheets

LIGHT SENSING ELEMENT AND MANUFACTURING METHOD THEREOF

CROSS-REFERENCES TO RELATED APPLICATIONS

This application claims priority to Taiwan Patent Application No. 111150770 filed on Dec. 29, 2022, which is hereby incorporated by reference in its entirety.

BACKGROUND OF THE INVENTION

Field of the Invention

The present invention relates to a light sensing element and a manufacturing method thereof, particularly a light sensing element and a manufacturing method thereof capable of effectively reducing noise.

Descriptions of the Related Art

Conventional light sensing elements will limit the passage of light within a specific spectrum by disposing a bandpass filter (BPF) film layer on the light receiving surface to provide the sensing function of specific light. At the same time, the bandpass filter film layer reflects light outside the specific spectrum to limit its entry into the light absorbing layer of the light sensing element, thereby reducing unnecessary noise generation.

It is known that in the conventional process, a cutting operation is performed on the preformed light sensing structure before the light sensing elements are formed to obtain the light sensing elements of the required size. However, most of the current cutting operations use diamond knives to cut so that the sidewalls of the light sensing elements formed by cutting become a light-transmissive surface. Since there is no BPF film layer on these sidewall surfaces, once light enters the interior of the device from any sidewall surface, the light outside the specific spectrum will be absorbed by the light absorbing layer, resulting in noise generation. As a result, the sensing accuracy and/or performance of conventional light sensing elements will be affected.

Therefore, it is worthwhile to study how to design a light sensing element and a manufacturing method thereof that can solve the above problems and suppress the noise generation.

SUMMARY OF THE INVENTION

An objective of the present invention is to provide a manufacturing method for a light sensing element capable of effectively reducing noise.

Another objective of the present invention is to provide a light sensing element manufactured using the aforementioned manufacturing method.

In order to achieve the above objectives, a manufacturing method of a light sensing element of the present invention includes the following steps: providing an epitaxy; performing a device process to form a semiconductor structure on the epitaxy, wherein the semiconductor structure includes a light absorbing layer and a plurality of sidewalls; performing a wet etching process to form a recess inward from a sidewall surface of each sidewall of the semiconductor structure; and performing a coating process to form a bandpass filter layer on the semiconductor structure. Light incident from each of the sidewalls is blocked from entering the light absorbing layer by the recess of each of the sidewalls.

In an embodiment of the present invention, the recess includes an inclined surface, the inclined surface forms an inclination angle with a top surface of the semiconductor structure, and the inclination angle is not greater than 60 degrees.

In an embodiment of the present invention, the step of performing the device process to form the semiconductor structure on the epitaxy further comprises the following steps: forming a first semiconductor layer on the epitaxy; forming the light absorbing layer on the first semiconductor layer; and forming a second semiconductor layer on the light absorbing layer to constitute the semiconductor structure having the sidewalls by the first semiconductor layer, the light absorbing layer and the second semiconductor layer.

In an embodiment of the present invention, the recess is at least between the top surface and the first semiconductor layer.

In an embodiment of the present invention, a recessed depth of the recess relative to the sidewall surface increases as the recess approaches the light absorbing layer.

In an embodiment of the present invention, the light absorbing layer is made of indium gallium arsenide (InGaAs), and the second semiconductor layer is made of indium phosphide (InP).

In an embodiment of the present invention, in the wet etching process, an etching solution containing hydrogen chloride, acetic acid and water or an etching solution containing rust water, rust substance and acetic acid is used to form the recess on each of the sidewalls.

In an embodiment of the present invention, in the wet etching process, photoresist is first used to pre-process each of the sidewalls of the semiconductor structure, then an object on which the epitaxy and the semiconductor structure have been formed is laid flat in an etching tank with the etching solution, and the etching tank is agitated in isotropic concentric circles so that the semiconductor structure is etched by the etching solution to form the recess.

In an embodiment of the present invention, an area of the bandpass filter layer is larger than an area of the light absorbing layer.

The present invention also includes a light sensing element manufactured using the aforementioned manufacturing method. The light sensing element at least includes an epitaxy, a semiconductor structure and a bandpass filter layer. The semiconductor structure is located on the epitaxy, and the semiconductor structure includes a light absorbing layer and a plurality of sidewalls. A recess is formed inward from the sidewall surface of each sidewall. Light incident from each of the sidewalls is blocked from entering the light absorbing layer by the recess. The bandpass filter layer is stacked on the semiconductor structure.

Accordingly, the present invention uses a wet etching process to form recesses inward on each sidewall of the semiconductor structure of the light sensing element so that the original light that obliquely enters the light sensing element without passing through the bandpass filter layer will be obstructed by the recesses and cannot directly enter the light absorbing layer, thereby reducing noise generation.

DETAILED DESCRIPTION OF THE PREFERRED EMBODIMENT

Since the various aspects and embodiments are merely illustrative and not restrictive, after reading this specification, a person having ordinary skill in the art may also have other aspects and embodiments without departing from the scope of the present invention. The features and advantages of these embodiments and the scope of the patent application will be better appreciated from the following detailed description.

Herein, "a" or "an" is used to describe one or more devices and components described herein. Such a descriptive term is merely for the convenience of illustration and to provide a general sense of the scope of the present invention. Therefore, unless expressly stated otherwise, the term "a" or "an" is to be understood to include one or at least one, and the singular form also includes the plural form.

Herein, the terms "first" or "second" and similar ordinal numbers are mainly used to distinguish or refer to the same or similar devices or structures, and do not necessarily imply the spatial or temporal order of such devices or structures. It should be understood that in certain situations or configurations, ordinal numbers may be used interchangeably without affecting the practice of the present invention.

As used herein, the term "comprise" "include," "have" or any other similar term is not intended to exclude additional, unrecited elements. For example, a device or structure comprising/including/having a plurality of elements is not limited to the elements listed herein but may comprise/include/have other elements not explicitly listed but generally inherent to the device or structure.

Figure 1:
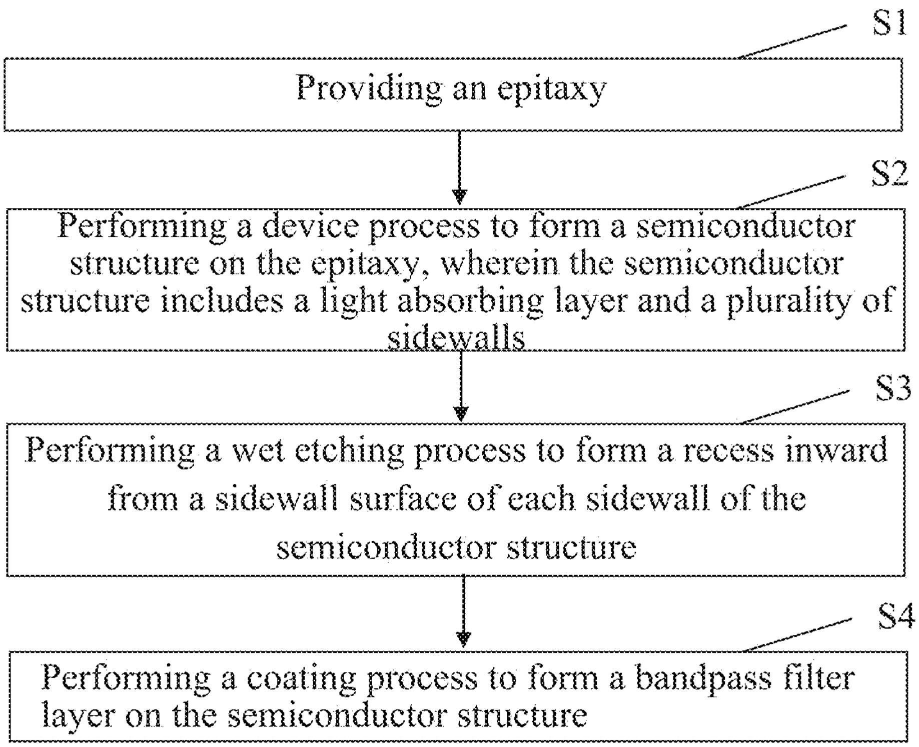
FIG. 1 is a flowchart of the manufacturing method of the light sensing element of the present invention.
Figure 2:
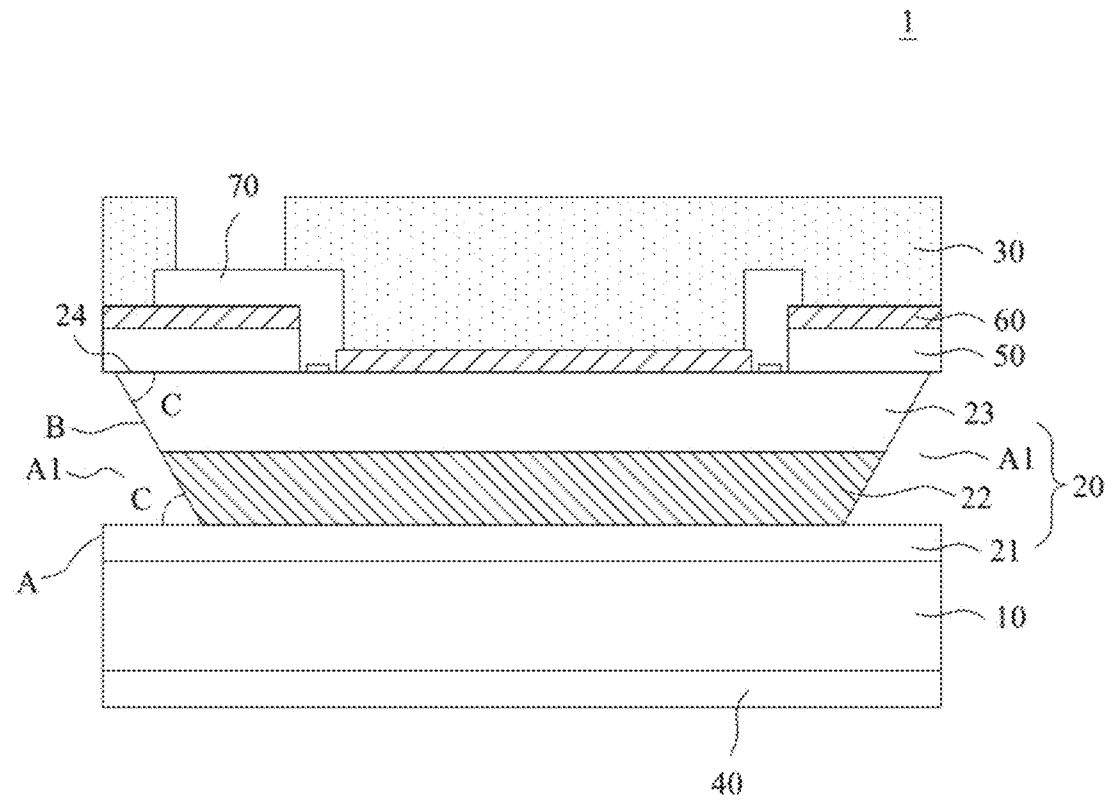
FIG. 2 is a schematic structural diagram of an embodiment of the light sensing element of the present invention.

Please refer to FIG. 1 and FIG. 2 together for the following descriptions. FIG. 1 is a flowchart of the manufacturing method of the light sensing element of the present invention, and FIG. 2 is a schematic view of the structures during the process corresponding to FIG. 1. As shown in FIGS. 1 and 2, the manufacturing method of the light sensing element of the present invention includes the following steps:

Step S1: providing an epitaxy.

First, the present invention provides the epitaxy 10 as a basic structure of the light sensing element 1 of the present invention. The epitaxy 10 may be made of semiconductor materials. For example, in the present invention, it is made of indium phosphide (InP) material. However, the material selection of the epitaxy 10 will vary according to different design requirements.

Step S2: performing a device process to form a semiconductor structure on the epitaxy, wherein the semiconductor structure includes a light absorbing layer and a plurality of sidewalls.

After the epitaxy 10 is provided in the above step S1, the present invention can perform the device process on the surface of one side of the epitaxy 10 to form the semiconductor structure 20 on the epitaxy 10. In an embodiment of the present invention, the semiconductor structure 20 is made of III-V group semiconductor materials. The structure of each layer may adopt different combinations of III-V group semiconductor materials, and selectively dope specific elements according to design requirements to form the semiconductor material layer with different characteristics, but the present invention is not limited thereto. The semiconductor structure 20 at least includes a light absorbing layer 22 and a plurality of sidewalls A.

Figure 3:
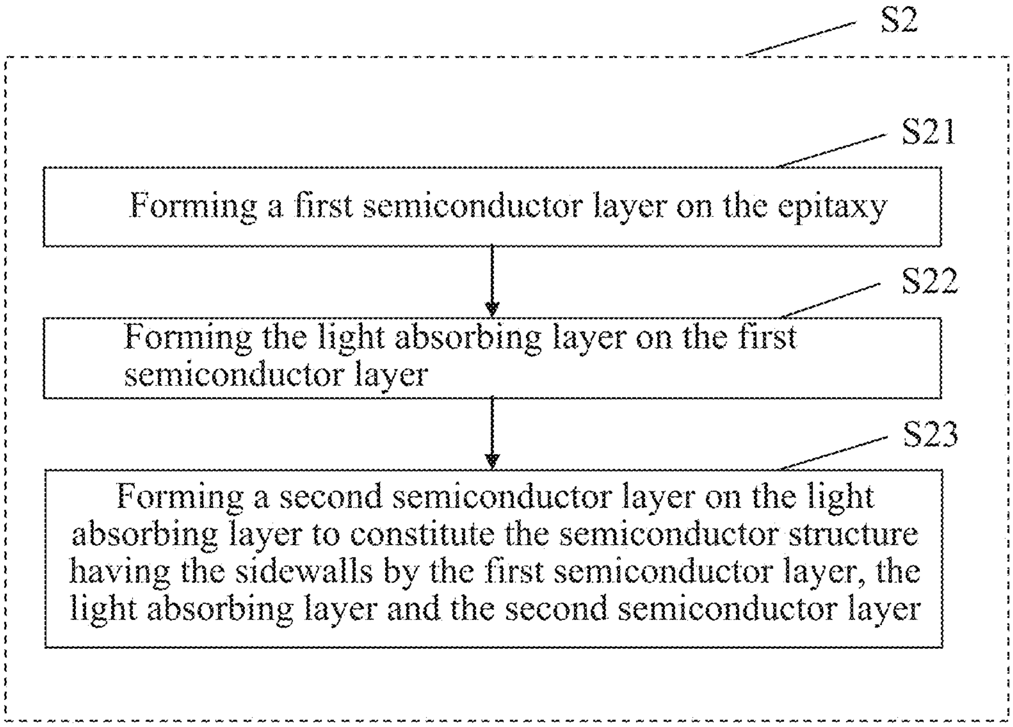
FIG. 3 is a detailed flowchart of the manufacturing method of the light sensing element of the present invention.

Please refer to FIGS. 1 to 3 for further description. FIG. 3 is the detailed flowchart of the manufacturing method of the light sensing element of the present invention. As shown in FIGS. 2 and 3, in an embodiment of the present invention, the semiconductor structure 20 includes a first semiconductor layer 21, a light absorbing layer 22 and a second semiconductor layer 23. Therefore, the present invention may further include the following steps in step S2:

Step S21: forming a first semiconductor layer 21 on the epitaxy 10.

After the epitaxy 10 is provided in the above step S1, the present invention can perform the device process on the surface of one side of the epitaxy 10 to form the first semiconductor layer 21 of the semiconductor structure 20 on the epitaxy 10. In the present invention, the first semiconductor layer 21 is made of silicon-doped indium phosphide (InP) material, but the material selection of the first semiconductor layer 21 will vary according to different design requirements.

Step S22: forming the light absorbing layer 22 on the first semiconductor layer 21. After the first semiconductor layer 21 is formed in the above step S21, the present invention can perform the device process on the surface of one side of the first semiconductor layer 21 to form the light absorbing layer 22 of the semiconductor structure 20 on the first semiconductor layer 21. In the present invention, the light absorbing layer 22 is made of undoped indium gallium arsenide (InGaAs) material, but the material selection of the light absorbing layer 22 will vary according to different design requirements.

Step S23: forming the second semiconductor layer 23 on the light absorbing layer 22. After forming the light absorbing layer 22 in the above step S22, the present invention can perform the device process on the surface of one side of the light absorbing layer 22 to form the second semiconductor layer 23 of the semiconductor structure 20 on the light absorbing layer 22. In the present invention, the second semiconductor layer 23 is made of silicon-doped indium phosphide material, but the material selection of the second semiconductor layer 23 will vary according to different design requirements.

Accordingly, the present invention constructs the overall semiconductor structure 20 by sequentially epitaxially stacking the first semiconductor layer 21, the light absorbing layer 22 and the second semiconductor layer 23 on the epitaxy 10. At this time, the semiconductor structure 20 includes a plurality of sidewalls A, and the semiconductor structure 20 forms an exposed top surface 24 on one side of the second semiconductor layer 23. In addition, the semiconductor structure 20 can form a first electrode 40 on the other side of the epitaxy 10, and the first electrode 40 is mainly made of an alloy material containing gold (Au).

On the other hand, a protective layer 50, an anti-reflection layer 60 and a second electrode 70 can be formed sequentially on the top surface 24 of the semiconductor structure 20. The protective layer 50 is mainly made of silicon oxide ($SiO_x$) material. The anti-reflection layer 60 is formed on the protective layer 50 and the top surface 24 of the semiconductor structure 20, and the anti-reflection layer 60 is mainly made of silicon nitride (SiN) material. The second electrode 70 maintains ohmic contact with the second semiconductor layer 23 of the semiconductor structure 20, and the second electrode 70 is mainly made of a material containing gold.

Step S3: performing a wet etching process to form a recess inward from a sidewall surface of each sidewall of the semiconductor structure.

After the semiconductor structure 20 is formed in the above step S2, the present invention can perform a wet etching process on each sidewall A of the semiconductor structure 20 to form a recess A1 inward on the sidewall surface of each sidewall A. In the aforementioned wet etching process, photoresist and etching solution are used to etch specific positions of each sidewall A to form the required recess A1. For example, in the wet etching process, photoresist is first used to preprocess specific positions of each sidewall A of the semiconductor structure 20 (i.e., the position where the recess A1 is predetermined to be formed). Next, the object on which the epitaxy 10 and the semiconductor structure 20 have been formed is laid flat in an etching tank with the etching solution, and the etching tank is agitated in isotropic concentric circles so that the semiconductor structure 20 is etched by the etching solution to form the recess A1. The etching solution can be selected according to the different materials of the semiconductor structure 20. In an embodiment of the present invention, in the wet etching process, an etching solution containing hydrogen chloride (HCl), acetic acid ($CH_3COOH$) and water is used to facilitate the etching of the indium phosphide material (e.g., the second semiconductor layer 23 as mentioned above). In another embodiment of the present invention, in the wet etching process, an etching solution containing rust water, rust substance and acetic acid is used to facilitate the etching of indium phosphide materials and indium gallium arsenide materials (e.g., the light absorbing layer 22 and the second The semiconductor layer 23 as mentioned above), but the present invention is not limited thereto.

The aforementioned recess A1 extends inward from the sidewall surface of the sidewall A. In an embodiment of the present invention, the recess A1 is at least between the top surface 24 of the semiconductor structure 20 and the first semiconductor layer 21. In other words, the recess A1 is mainly formed at the location of the light absorbing layer 22 and the second semiconductor layer 23 of the semiconductor structure 20. In response to performing the aforementioned wet etching process, the recessed depth of the recess A1 relative to the sidewall surface of the sidewall A will increase as the recess A1 approaches the light absorbing layer 22. Therefore, in the structure design, the recess A1 has an asymmetric recessed structure based on the direction perpendicular to the sidewall A. In an embodiment of the present invention, the recess A1 includes an inclined surface B. The distance between the inclined surface B and the original sidewall surface of the sidewall A increases as the inclined surface B approaches the light absorbing layer 22. The inclined surface B forms an inclination angle C with the top surface 24 of the semiconductor structure 20, and the inclination angle C is not greater than 60 degrees. In other words, when the inclination angle C is smaller, the inclined surface B will become gentler so that the recessed depth of the recess A1 relative to the sidewall surface of the sidewall A increases.

Step S4: performing a coating process to form a bandpass filter layer on the semiconductor structure.

After forming the recess A1 in the above step S3, the present invention can perform a coating process on the semiconductor structure 20, on which the related processes have been performed, to form the bandpass filter layer 30 on the semiconductor structure 20. The bandpass filter layer 30 is substantially stacked on the semiconductor structure 20. In this embodiment, the bandpass filter layer 30 is formed on the anti-reflection layer 60 and the second electrode 70 above the semiconductor structure 20. The bandpass filter layer 30 is mainly used to limit the passage of light in a single or multiple specific spectra, and to block the passage of light outside the aforementioned specific spectra (e.g., the so-called stop band spectrum). The bandpass filter layer 30 is a multilayer structure stacked with light-transmitting materials by a coating process. Different material combinations may be used for the structure of each layer so that the bandpass filter layer 30 can be formed with the characteristics of allowing the light in the specific spectra in the different ranges to pass therethrough and blocking the light in the different spectra from passing therethrough according to the design requirements. For example, the bandpass filter layer 30 may be formed by stacking a combination of 15-20 pairs of hydrogen silicide layers and silicon dioxide layers such that the bandpass filter layer 30 is applied to make light of a specific spectrum pass through it and for light of a specific spectrum to be cut off, but the present invention is not limited thereto.

In the structure design, the area of the bandpass filter layer 30 is larger than the area of the light absorbing layer 22 of the semiconductor structure 20, and the coverage of the surface of the light absorbing layer 22 is located within the coverage of the surface of the bandpass filter layer 30.

Under normal circumstances, light irradiating perpendicularly or obliquely to the surface of the bandpass filter layer 30 of the light sensing element 1 of the present invention (e.g., within 30 degrees from the vertical direction) can enter the light absorbing layer 22 of the semiconductor structure 20 after passing through the bandpass filter layer 30 so that the light received by the light absorbing layer 22 is light substantially within a specific spectrum. The light irradiating obliquely to the sidewall A of the light sensing element 1 of the present invention without passing through the bandpass filter layer 30 (e.g., deviating from the vertical direction by 30 degrees or less) will be blocked by providing the recess A1 of the sidewall A so that the light cannot enter the light absorbing layer 22 but can only enter the first semiconductor layer 21 below so that the light will not be absorbed by the light absorbing layer 22. Accordingly, the configuration of the recess A1 of each sidewall A can provide the effect of blocking the light incident from each sidewall A from entering the light absorbing layer 22, thereby reducing noise generation.

Further, as shown in FIG. 2, the present invention also includes a light sensing element 1 manufactured using the aforementioned manufacturing method. The light sensing element 1 of the present invention at least includes the epitaxy 10, the semiconductor structure 20 and the bandpass filter layer 30. The semiconductor structure 20 is located on the epitaxy 10, and the semiconductor structure 20 includes the light absorbing layer 22 and the sidewalls A. The recess A1 is formed inward from the sidewall surface of each sidewall A, and the recess A1 blocks the light incident from each sidewall A from entering the light absorbing layer 22. The bandpass filter layer 30 is stacked on the semiconductor structure 20. In addition, the semiconductor structure 20 and the bandpass filter layer 30 may further include a layered structure formed of other materials by corresponding processes, e.g., an electrode layer, an insulating layer, an anti-reflection layer, etc.

The foregoing detailed description is illustrative in nature only and is not intended to limit the embodiments of the claimed subject matters or the applications or uses of such embodiments. Furthermore, while at least one exemplary embodiment has been presented in the foregoing detailed description, it should be appreciated that a wide variety of modifications to the present invention are possible. It should also be appreciated that the embodiments described herein are not intended to limit the scope, use, or configuration of the claimed subject matters in any way. Instead, the foregoing detailed description is intended to provide a person having ordinary skill in the art with a convenient guide for implementing one or more of the described embodiments. Moreover, various modifications may be made in the function and arrangement of the devices without departing from the scope defined by the claims, including known equivalents and any equivalents that may be anticipated at the time of filing this patent application.

What is claimed is:

1. A manufacturing method for a light sensing element, comprising the following steps:

providing an epitaxy;

performing a device process to form a semiconductor structure on the epitaxy, wherein the semiconductor structure comprises a light absorbing layer and a plurality of sidewalls;

performing a wet etching process to form a recess inward from a sidewall surface of each of the sidewalls of the semiconductor structure, an etching solution containing hydrogen chloride, acetic acid and water or an etching solution containing rust water, rust substance and acetic acid, and photoresist is first used to pre-process each of the sidewalls of the semiconductor structure, then an object on which the epitaxy and the semiconductor structure have been formed is laid flat in an etching tank with the etching solution, and the etching tank is agitated in isotropic concentric circles so that the semiconductor structure is etched by the etching solution to form the recess; and performing a coating process to form a bandpass filter layer on the semiconductor structure;

wherein light incident from each of the sidewalls is blocked from entering the light absorbing layer by the recess of each of the sidewalls.

2. The manufacturing method of claim 1, wherein the recess includes an inclined surface, the inclined surface forms an inclination angle with a top surface of the semiconductor structure, and the inclination angle is not greater than 60 degrees.

3. The manufacturing method of claim 2, wherein the step of performing the device process to form the semiconductor structure on the epitaxy further comprises the following steps:

forming a first semiconductor layer on the epitaxy;

forming the light absorbing layer on the first semiconductor layer; and forming a second semiconductor layer on the light absorbing layer to constitute the semiconductor structure having the sidewalls by the first semiconductor layer, the light absorbing layer and the second semiconductor layer.

4. The manufacturing method of claim 3, wherein the recess is at least between the top surface and the first semiconductor layer.

5. The manufacturing method of claim 2, wherein a recessed depth of the recess relative to the sidewall surface increases as the recess approaches the light absorbing layer.

6. The manufacturing method of claim 1, wherein the light absorbing layer is made of indium gallium arsenide, and the second semiconductor layer is made of indium phosphide.

7. The manufacturing method of claim 1, wherein an area of the bandpass filter layer is larger than an area of the light absorbing layer.

8. A light sensing element manufactured by the manufacturing method of claim 1, the light sensing element at least comprising:

an epitaxy;

a semiconductor structure located on the epitaxy, the semiconductor structure comprising a light absorbing layer and a plurality of sidewalls, wherein each of the sidewalls forms a recess inward from a sidewall surface, and light incident from each of the sidewalls is blocked from entering the light absorbing layer by the recess of each of the sidewalls; and a bandpass filter layer stacked on the semiconductor structure.

* * * * *